(12) United States Patent
Hiraoka (10) Patent No.: US 11,139,785 B2
(45) Date of Patent: Oct. 5, 2021

(54) LOW NOISE AMPLIFIER CIRCUIT

(71) Applicant: Asahi Kasei Microdevices Corporation, Tokyo (JP)

(72) Inventor: Norimasa Hiraoka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/889,810

(22) Filed: Jun. 2, 2020

(65) Prior Publication Data

US 2020/0389133 A1 Dec. 10, 2020

(30) Foreign Application Priority Data

Jun. 4, 2019 (JP) .............................. JP2019-104333

(51) Int. Cl.
*H03F 3/19* (2006.01)

(52) U.S. Cl.
CPC ......... *H03F 3/19* (2013.01); *H03F 2200/294* (2013.01); *H03F 2200/372* (2013.01)

(58) Field of Classification Search
CPC ................ H03F 3/19; H03F 2200/294; H03F 2200/372
USPC ....................................................... 330/277
See application file for complete search history.

(56) References Cited

U.S. PATENT DOCUMENTS 9,973,149 B2 * 5/2018 Ayranci .................. H03F 1/086
10,284,151 B2 * 5/2019 Noori .................... H03G 1/0029
2009/0085668 A1 * 4/2009 Gao ........................ H03F 1/0277
330/295
2013/0314164 A1 * 11/2013 Din ....................... H03F 1/0205
330/296
2016/0056774 A1 * 2/2016 Ilkov ..................... H03F 1/565
330/251

OTHER PUBLICATIONS

Tzeng et al.,"A Multiband Inductor-Reuse CMOS Low-Noise Amplifier", IEEE Transactions On Circuitsand Systems—II: Express Briefs, vol. 55, No. 3, Mar. 2008 pp. 209-213. (Year: 2008).*
Eslamifar et al.."Design A Dual-band Low-power CMOS Low noise Amplifier for Use in WLAN Applications", The 22nd Iranian Conference on Electrical Engineering (ICEE 2014), May 20-22, 2014, Shahid Beheshti University. (Year: 2014).*

* cited by examiner

*Primary Examiner* — Hafizur Rahman
(74) *Attorney, Agent, or Firm* — JCIPRNET (57) ABSTRACT

An LNA circuit includes: paths provided between an input and an output terminals, an LNA provided in at least one path, and a selector selecting one path. The LNA includes: a MOS transistor coupled between a first and a second power supplies, a first inductor coupled to a source of the MOS transistor, a capacitor formed between a gate and the source of the MOS transistor, a second inductor coupled between the gate of the MOS transistor and the input terminal, and a changeover switch coupled parallelly with at least one of the capacitor, and the first and the second inductors. The selector switches between a first state that one path is selected and the changeover switch is on, and a second state that another path is selected and the changeover switch is off. Alternatively, the one path and the another path are respectively provided without and with the LNA.

5 Claims, 8 Drawing Sheets

LOW NOISE AMPLIFIER CIRCUIT

CROSS-REFERENCE TO RELATED APPLICATION

This application claims the priority benefits of Japanese application no. 2019-104333, filed on Jun. 4, 2019. The entirety of the above-mentioned patent application is hereby incorporated by reference herein and made a part of this specification.

BACKGROUND

Technical Field

The disclosure relates to a low noise amplifier circuit.

Description of Related Art

In a wireless receiver, a signal at a relatively low level, which is received by an antenna, is amplified by an LNA (Low Noise Amplifier). However, for wireless receivers in an environment where a plurality of devices is used in a short distance, such as wireless microphones, a signal upon which a signal in a neighboring channel is superimposed in addition to a signal in a desired channel may be received. The signal with the signal in the neighboring channel superimposed upon may have a higher signal level than the signal in the desired channel, and when such a signal is amplified by the LNA, the signal may be saturated and the distortion characteristic may deteriorate.

Therefore, a low noise amplifier circuit has been proposed, in which a detour path that does not pass through the LNA is provided in parallel with a path that passes through the LNA so as to switch between the path that passes through the LNA and the detour path according to the signal level of the received signal, for example (see Patent Document 1 (US Patent Application Publication No. 2016/0056774), for example). Moreover, since the characteristics of the LNA are usually in a trade-off with the input frequency band, the input frequency band may become narrow in order to improve the noise characteristic. In recent years, there has been an increasing need for a receiver that can have reception across various countries and regions by one wireless terminal, and it is necessary to apply LNA to a wide band without deteriorating the characteristics. As one of the solutions, it is conceivable to arrange a plurality of narrow-band LNAs having good characteristics in parallel and select the LNA having the best characteristics according to the reception band.

For example, as an LNA, a circuit which has two output paths has been proposed, and the circuit is configured to generate a signal from either one or both of the two output paths by powering on or off an input NMOS transistor group included in each output path (see Patent Document 2 (U.S. Pat. No. 9,973,149), for example). In the LNA having such a circuit configuration, as the input NMOS transistor group is switched on and off, a transconductance gm of the input NMOS transistor group may change and an input impedance Zin may change. In other words, 50Ω matching cannot be achieved. Therefore, by turning a switch circuit on and off, the value of the inductance connected to a capacitor serving as an input matching element provided between the gate and the source of the input NMOS transistor or coupled to the source is virtually changed so that the input impedance does not become "0Ω" at the resonance frequency, and the change of the input impedance caused by the change of the transconductance of the input NMOS transistor is suppressed. By the way, regarding the LNA shown in FIG. 3 of Patent Document 2, the input impedance when either one of the input NMOS transistor groups 202 and 204 is powered on or when both are powered on can be expressed by the following equation (1).

$$Z_{in} = \frac{g_m L_s}{C_{gs}} + j\omega(L_s + L_g) + \frac{1}{j\omega C_{gs}} \quad (1)$$

In the equation (1), gm is the transconductance of the input NMOS transistors 210 and 214, Cgs is the capacitor 301 between the gates and the sources of the input NMOS transistors 210 and 214, Ls is the inductances 236 and 238 coupled to the source of the input NMOS transistor, Lg is the inductance 208 coupled to the gate of the input NMOS transistor, and ω is the angular frequency.

Usually, resonance is performed so that the imaginary number component of the equation (1) becomes "0" at the resonance frequency $\omega_0$ of the main signal, and the values of the transconductance gm, the capacitor Cgs, and the inductances Ls and Lg are selected so that the real number component becomes 50Ω. However, if the transconductance gm changes, the real number component changes, and if the input impedance changes from 50Ω, the signal may not be propagated for reflection occurs at the input end. Thus, in the LNA of Patent Document 2, as the transconductance gm of the input NMOS transistor group changes, the capacitor Cgs and the inductance Ls are switched to change the values thereof, thereby switching the two output paths while maintaining the input impedance Zin at 50Ω matching.

According to Patent Document 2, however, the values of the capacitor and the inductor are changed by switching the connection with the switch circuit. In addition, the inductor Lg, the capacitor Cgs, and the source inductor Ls serving as input matching elements are coupled in series, and the switch circuit for changing the values of the capacitor and the inductor is coupled in series with the input matching element. Therefore, when a signal is generated from either one or both of the two output paths, if the switch circuit is turned on and the values of the capacitor and the inductor are changed, the switch circuit becomes a resistance component, resulting in deterioration of the noise characteristic.

In particular, when the LNA is applied to a low noise amplifier circuit which is configured to switch between the path that passes through the LNA and the detour path according to the signal level, as described in Patent Document 1, since a signal at a relatively low signal level is received in the path that passes through the LNA, the LNA is greatly affected by the deterioration of the noise characteristic resulting from the provision of the switch circuit. Thus, the disclosure provides a low noise amplifier circuit capable of passing an input signal by switching between a path that passes through the LNA and a detour path without causing deterioration of the noise characteristic.

SUMMARY

A low noise amplifier circuit according to an embodiment of the disclosure includes: a plurality of paths provided between an input terminal and an output terminal; a low noise amplifier provided in at least one of the plurality of paths and including a MOS transistor coupled between a first power supply and a second power supply, a first inductor coupled to a source terminal of the MOS transistor, a capacitor formed between a gate terminal and the source terminal of the MOS transistor, a second inductor coupled between the gate terminal of the MOS transistor and the input terminal, and a changeover switch coupled in parallel with at least one of the first inductor, the capacitor, and the second inductor; and a selector selecting one of the plurality of paths. The selector switches between a first state, in which a path that does not include the low noise amplifier is selected and the changeover switch is turned on, and a second state, in which a path that includes the low noise amplifier is selected and the changeover switch is turned off.

A low noise amplifier circuit according to another embodiment of the disclosure includes: a first path transmitting an input signal from an input terminal to an output terminal; a second path provided in parallel with the first path and including a low noise amplifier including a MOS transistor coupled between a first power supply and a second power supply, a first inductor coupled to a source terminal of the MOS transistor, a capacitor formed between a gate terminal and the source terminal of the MOS transistor, a second inductor coupled between the gate terminal of the MOS transistor and the input terminal, and a changeover switch coupled in parallel with at least one of the first inductor, the capacitor, and the second inductor; and a selector selecting one of the first path and the second path as a path transmitting the input signal. The selector switches between a first state, in which the first path is selected and the changeover switch is turned on, and a second state, in which the second path is selected and the changeover switch is turned off.

According to the disclosure, it is possible to pass the input signal by switching between the path that passes through the low noise amplifier part and another path, and prevent the deterioration of the noise characteristic.

DESCRIPTION OF THE EMBODIMENTS

In the following detailed description, numerous particular and specific configurations are set forth to provide a thorough understanding of the embodiments of the disclosure. However, it should be apparent that other embodiments can be implemented without being limited to such particular and specific configurations. In addition, the following embodiments are not intended to limit the disclosure according to the claims, and include any combination of the characteristic configurations described in the embodiments. An embodiment of the disclosure will be described with reference to the drawings hereinafter. In the following description of the drawings, the same portions are assigned with the same reference numerals. However, the drawings are schematic, and the relationship between the thickness and the plane dimension, the ratio of the thicknesses of the layers, etc. may be different from the actual ones.

Figure 1:
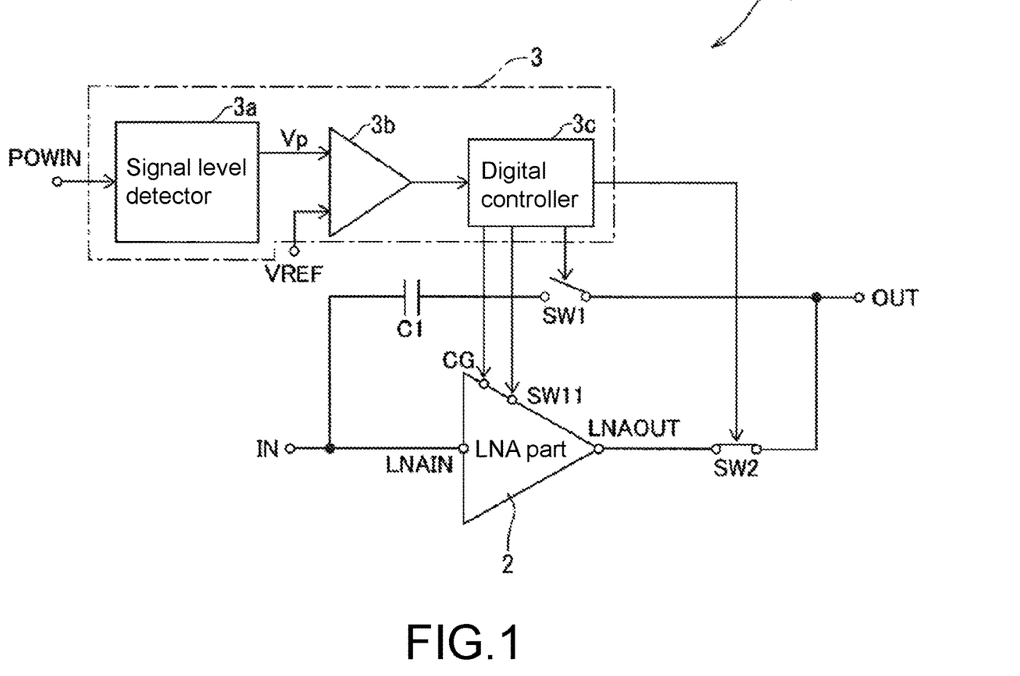
FIG. 1 is a configuration diagram showing an example of the low noise amplifier circuit according to an embodiment of the disclosure.

First, the first embodiment will be described. FIG. 1 is a configuration diagram showing an example of a low noise amplifier circuit according to the disclosure. The low noise amplifier circuit 1 includes a plurality of paths provided between an input terminal IN and an output terminal OUT, an LNA part (low noise amplifier part) 2 provided in at least one of the plurality of paths, and a selector 3 that selects one of the plurality of paths. As an example, the low noise amplifier circuit 1 has two parallel paths between the input terminal IN and the output terminal OUT of the low noise amplifier circuit 1, as shown in FIG. 1. A DC component removing capacitor C1 and a bypass switch (switch circuit) SW1 that are coupled in series are coupled to one path between the input terminal IN and the output terminal OUT. The LNA part (low noise amplifier part) 2 and a switch SW2 coupled to the output side of the LNA part 2 are coupled to the other path between the input terminal IN and the output terminal OUT.

The bypass switch SW1, the switch SW2, and the LNA part 2 are controlled by a selection circuit (selector) 3. The selection circuit 3 includes a signal level detector 3a, a comparator 3b, and a digital controller 3c. The signal level detector 3a receives a power signal POWIN capable of detecting the signal level of a received signal, such as a signal received by the input terminal IN or a signal generated from the output terminal OUT or a signal down-converted by a demodulator provided in the subsequent stage of the LNA part 2 in a wireless receiver (not shown) including the low noise amplifier circuit 1, and the signal level detector 3a detects the signal level of the power signal POWIN. The comparator 3b compares a signal Vp representing the signal level detected by the signal level detector 3a with a reference signal VREF, and provides a comparison result to the digital controller 3c. The reference signal VREF is a threshold value of the signal level of the received signal for switching between forming a path that passes through the LNA part 2 and forming a detour path that does not pass through the LNA part 2, and is set in advance.

The digital controller 3c controls the bypass switch SW1, the switch SW2, and the LNA part 2 based on the output of the comparator 3b. Nevertheless, the DC component removing capacitor C1 is not necessarily provided. In other words, at least one bypass switch SW1 that cuts off the connection between the input terminal IN and the output terminal OUT is provided in the path that does not include the LNA part 2. Further, the bypass switch SW1 serving as a switch circuit may be formed by one switch or may be formed by combining a plurality of switches to configure an attenuator. In short, the switch circuit can cut off the connection between the input terminal IN and the output terminal OUT. Further, the switch SW2 is provided to set the output impedance of the path that passes through the LNA part 2 viewed from the output terminal OUT to a high impedance, and is not necessarily provided.

Figure 2:
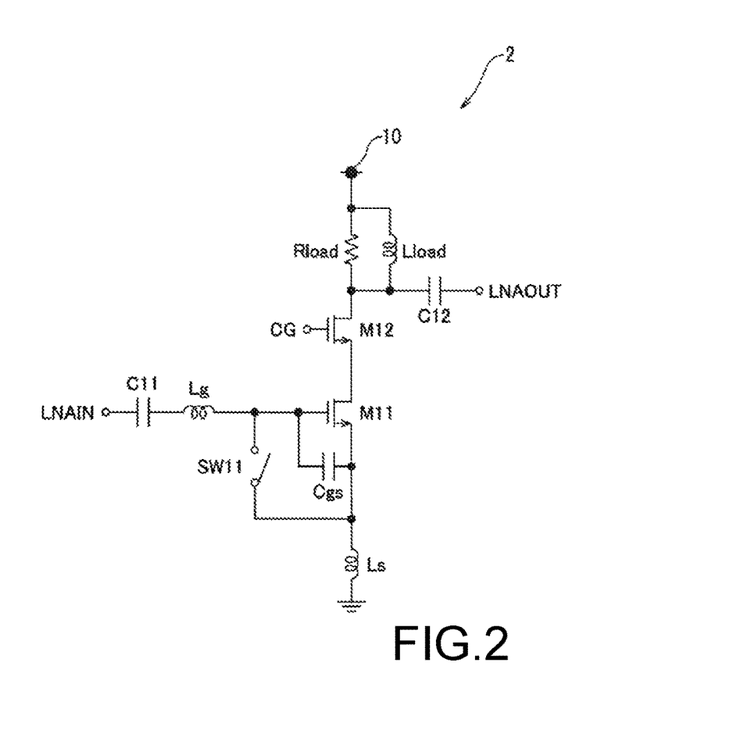
FIG. 2 is a configuration diagram showing an example of the LNA part according to the first embodiment.
Figure 12:
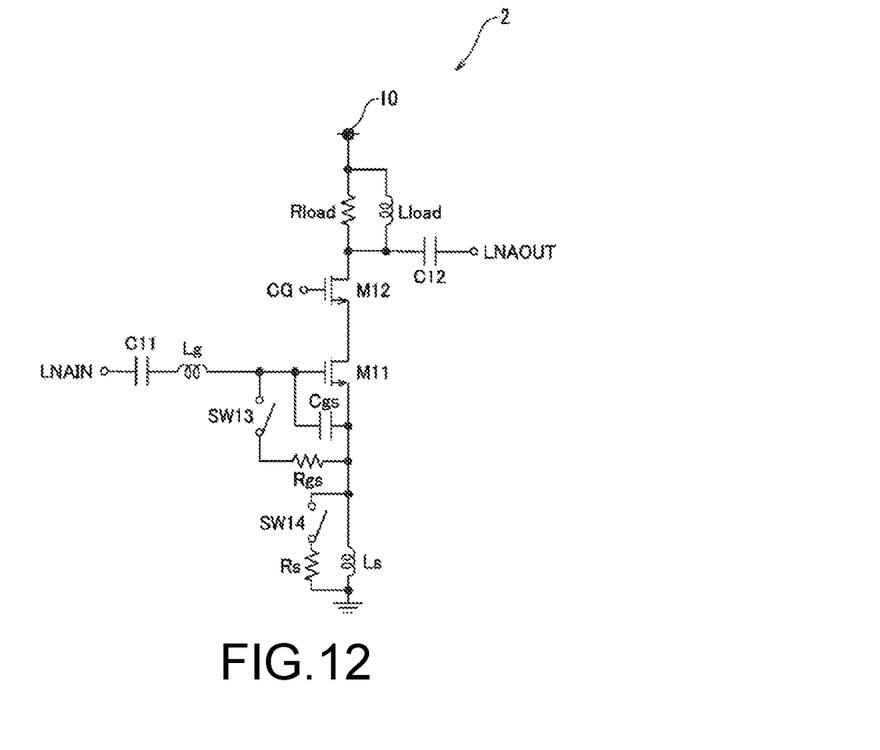
FIG. 12 is a modified example of the LNA part.

FIG. 2 is a configuration diagram showing an example of the LNA part 2. The LNA part 2 includes input NMOS transistors M11 and M12 coupled in series (hereinafter, also simply referred to as input transistors); a load resistor Rload and a load inductor Lload coupled in parallel with the load resistor Rload, which are coupled between the drain of the input transistor M12 and a first power supply 10; and a source inductor (first inductor) Ls serving as an input matching element coupled between the source of the input transistor M11 and a second power supply (low potential side). The drain of the input transistor M12 is coupled to an output terminal LNAOUT of the LNA part 2 via a DC component removing capacitor C12. A control signal CG from the digital controller 3*c* is received by the gate terminal of the input transistor M12. The gate terminal of the input transistor M11 is coupled to an input terminal LNAIN of the LNA part 2 via a gate inductor (second inductor) Lg serving as an input matching element and a capacitor C11 coupled in series with the gate inductor Lg. In addition, a capacitor Cgs (also including a parasitic capacitor of the input transistor M11) serving as an input matching element is coupled between the gate and the source of the input transistor M11, and a switch (changeover switch) SW11 serving as a resistance component having an on-resistance Ron is coupled in parallel with the capacitor Cgs. The changeover switch SW11 includes a switch circuit and a resistance element coupled in series with the switch circuit. The DC component removing capacitor C12 is not necessarily provided. In addition, the drain of the input transistor M11 may be coupled to the source of the cascode stage input transistor M12 as shown in FIG. 12 or may be directly coupled to the output load resistor Rload, the load inductor Lload, and the capacitor C12. In other words, the low noise amplifier part 2 is provided in at least one of the plurality of paths described above, and includes the input MOS transistor M11 coupled between the first power supply 10 and the second power supply; the first inductor Ls coupled to the source terminal of the input MOS transistor M11; the capacitor formed between the gate terminal and the source terminal of the input MOS transistor M11; the second inductor Lg coupled between the gate terminal of the input MOS transistor M11 and the input terminal IN; and the changeover switch SW11 coupled in parallel with at least one of the first inductor Ls, the capacitor, and the second inductor Lg. Thus, the selector 3 switches between a first state, in which the path that does not have the low noise amplifier part 2 is selected and the changeover switch SW11 is turned on, and a second state, in which the path that has the low noise amplifier part 2 is selected and the changeover switch SW11 is turned off. Further, at least one of the plurality of paths described above is a first path for transmitting an input signal from the input terminal IN to the output terminal OUT, and the selector 3 switches between a first state, in which the first path is selected and the changeover switch SW11 is turned on, and a second state, in which the path that has the low noise amplifier part 2 is selected and the changeover switch SW11 is turned off. According to another embodiment, if there are two paths and one has the low noise amplifier part 2, the first path transmits the input signal from the input terminal to the output terminal, and the second path is provided in parallel with the first path. At this time, the selector 3 switches between a first state, in which the first path is selected and the changeover switch SW11 is turned on, and a second state, in which the second path is selected and the changeover switch SW11 is turned off.

Next, the operation of the low noise amplifier circuit 1 according to the first embodiment will be described. The signal level detector 3*a* detects the signal level Vp of the RF received signal received by the low noise amplifier circuit 1 based on the power signal POWIN, such as a signal received by the input terminal IN or a signal generated from the output terminal OUT or a signal down-converted by a demodulator provided in the subsequent stage (not shown), and provides the result of comparison between the signal level Vp and the reference signal VREF obtained by the comparator 3*b* to the digital controller 3*c*.

When the signal level Vp is lower than the reference signal VREF, that is, when the signal in the neighboring channel is not overlapped with the received RF received signal and it is predicted that the distortion characteristic will not deteriorate even if the RF received signal is amplified by the LNA part 2, in the digital controller 3*c*, the bypass switch SW1 is controlled to be off and the switch SW2 is controlled to be on. Further, the digital controller 3*c* generates a control signal CG for controlling the switch SW11 of the LNA part 2 to be off and controlling the input transistor M12 to be on. Thus, a path that passes through the input terminal IN, the LNA part 2, the switch SW2, and the output terminal OUT is formed, and the RF received signal is amplified by the LNA part 2 and generated. In other words, in the LNA part 2, since the input transistor M12 is in the on state, the received RF received signal is amplified with a constant amplification factor and generated from the output terminal LNAOUT.

On the other hand, when the signal level Vp is equal to or higher than the reference signal VREF, the digital controller 3*c* controls the bypass switch SW1 to be on and the switch SW2 to be off. Further, the digital controller 3*c* generates a control signal CG for controlling the switch SW11 of the LNA part 2 to be on and controlling the input transistor M12 to be off. Thus, a detour path that passes through the input terminal IN, the capacitor C1, the bypass switch SW1, and the output terminal OUT is formed, and the RF received signal is generated without being amplified. In other words, in the LNA part 2, since the input transistor M12 is in the off state and the switch SW11 is on, the signal passing through the path that passes through the LNA part 2 is not transmitted to the output terminal OUT. Therefore, the signal passing through the detour path, that is, the RF received signal received by the input terminal IN, is transmitted to the output terminal OUT without being amplified. Further, in the path that passes through the LNA part 2, since the input transistor M12 is in the off state, that is, the LNA part 2 is in the state of being powered off (hereinafter, also referred to as LNA being powered off), the power consumption can be reduced accordingly.

Here, as described above, when the signal level Vp is equal to or higher than the reference signal VREF, that is, when the signal in the neighboring channel is overlapped with the received RF received signal, the signal level is high compared to a case where the signal in the neighboring channel is not overlapped. Therefore, when a signal at a relatively high signal level is amplified by the LNA part 2, the distortion of the RF received signal increases after amplification, and as a result, the distortion of the signal waveform generated from the output terminal OUT increases. However, since a detour path is formed and the amplification of the LNA part 2 is not performed when the signal level Vp is equal to or higher than the reference signal VREF, it is possible to prevent the distortion in the signal waveform from increasing.

In addition, in the LNA part 2, the switch SW11 having the on-resistance Ron is coupled in parallel with the capacitor Cgs. The on-resistance Ron is set to a value so that when the LNA is powered off and the switch SW11 is turned on, the real number component in the equation representing the input impedance viewed from the side of the input terminal LNAIN of the LNA part 2 does not become "0Ω". Further, when the switch SW11 is off, that is, when the RF received signal passes through the path that passes through the LNA part 2, resonance is performed so that the imaginary number component in the equation representing the input impedance at the resonance frequency $\omega_0$ of the main signal becomes "0", and the transconductance gm of the input transistor M11 and the values of the source inductor Ls, the gate inductor Lg, and the capacitor Cgs serving as the input matching elements are selected so that the real number component becomes "50Ω". As shown in FIG. 2, the input impedance Zin when the switch SW11 having the resistance component Ron is provided in parallel with Cgs, which is one of the input matching elements, can be expressed by the following equation (2). The symbol "//" in the equation (2) means an impedance when the former and the latter of "//" are in a parallel relationship.

$$Z_{in} = \frac{g_m j\omega L_s}{R_{on} // \left(\frac{1}{j\omega C_{gs}}\right)} + j\omega(L_s + L_g) + R_{on} // \frac{1}{j\omega C_{gs}} \quad (2)$$

In the low noise amplifier circuit 1, when the LNA part 2 is operated (hereinafter, also referred to as LNA being powered on), that is, when a signal passes through the path that passes through the LNA part 2, since the switch SW11 is controlled to be off, an off-resistance Roff of the switch SW11 becomes infinite. If Ron in the equation (2) is replaced with Roff and Roff is treated as infinity, the input impedance when the LNA is powered on can be approximated to the equation (1) representing the input impedance in the LNA described in Patent Document 2.

In other words, in the case where the gate inductor Lg, the capacitor Cgs, and the source inductor Ls serving as the input matching elements are coupled in series, if a switch is coupled in series with all of these input matching elements, the noise characteristic deteriorates due to the switch when the LNA is powered on. However, in the LNA part 2 according to the present embodiment, the switch SW11 is provided in parallel with the capacitor Cgs as shown in FIG. 2, and the switch SW11 is turned off when the LNA is powered on. Therefore, it is possible to prevent deterioration of the noise characteristic, which results from turning on the switch coupled in series with all of the source inductor Ls, the gate inductor Lg, and the capacitor Cgs serving as the input matching elements, when the LNA is powered on. Further, in the LNA part 2, when the LNA is powered off to turn off the input transistor M12, the input impedance at the resonance frequency $\omega_0$ can be expressed by the following equation (3) and does not become "0Ω". Therefore, when the LNA is powered off, the RF received signal can be passed to the bypass path side.

$$Z_{in} = R_{on} // \frac{1}{j\omega_0 C_{gs}} + j\omega_0(L_s + L_g) \quad (3)$$

As described above, in the LNA part 2 according to the first embodiment of the disclosure, the switch SW11, which is a resistance component, is coupled in parallel with the capacitor Cgs serving as the input matching element, so that when the LNA is powered off, the input impedance can be prevented from becoming "0Ω" at the resonance frequency. In addition, when the LNA is powered on, the resistance component is removed from the input matching element, that is, the series relationship is eliminated, so that it is possible to prevent the noise characteristic from deteriorating due to the change of the resistance component resulting from the switch SW11. Therefore, in the low noise amplifier circuit 1, when a path that passes through the LNA part 2 is formed, the RF received signal can be amplified without deteriorating the noise characteristic, and when a detour path is formed, the RF received signal can be passed through the detour path.

Figure 3:
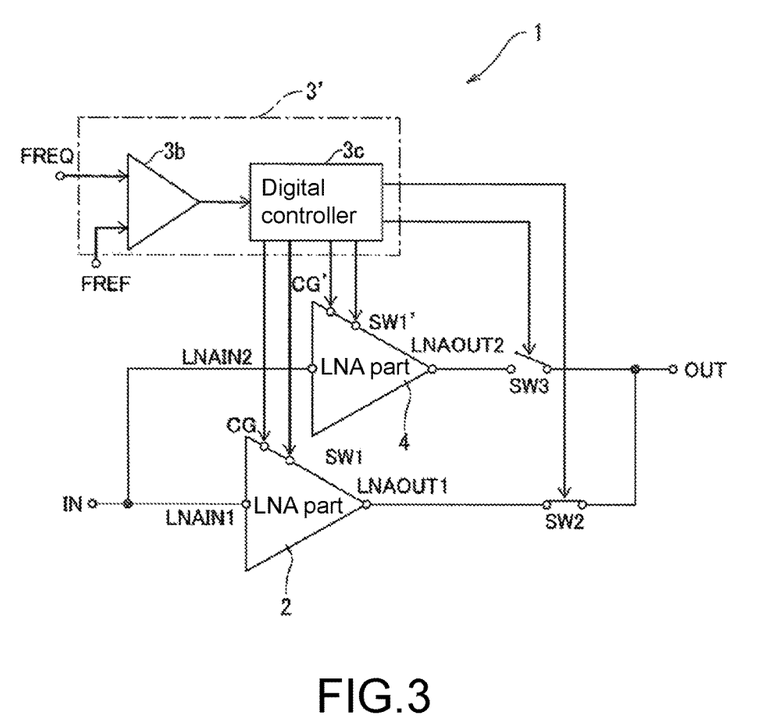
FIG. 3 is a configuration diagram showing an example of the low noise amplifier circuit according to the second embodiment of the disclosure.

Next, the second embodiment of the disclosure will be described. FIG. 3 is a configuration diagram showing an example of the low noise amplifier circuit according to the second embodiment. As shown in FIG. 3, the low noise amplifier circuit 1 according to the second embodiment has two parallel paths between the input terminal IN and the output terminal OUT of the low noise amplifier circuit 1. An LNA part (low noise amplifier part) 4 and a switch SW3 coupled to the output side of the LNA part 4 are coupled to one path between the input terminal IN and the output terminal OUT. An LNA part (low noise amplifier part) 2 and a switch SW2 coupled to the output side of the LNA part 2 are coupled to the other path between the input terminal IN and the output terminal OUT. The LNA part 2 and the LNA part 4 have the same functional configuration, and have the same functional configuration as the LNA part 2 in the first embodiment.

The switch SW2, the switch SW3, the LNA part 2, and the LNA part 4 are controlled by a selection circuit (selector) 3'. The selection circuit 3' includes a comparator 3b and a digital controller 3c. The comparator 3b compares a received frequency setting signal FREQ capable of setting the frequency of a received signal, such as a local signal frequency of a demodulator provided in the subsequent stage of the LNA parts 2 and 4 in a wireless receiver (not shown) including the low noise amplifier circuit 1, with a reference signal FREF, and provides a comparison result to the digital controller 3c. The reference signal FREF is a threshold value of the frequency of the received signal for switching between forming a path that passes through the LNA part 2 and forming a path that passes through the LNA part 4, and is set in advance.

The digital controller 3c controls the switch SW2, the switch SW3, and the LNA part 2 and the LNA part 4 based on the output of the comparator 3b. Three or more LNA parts arranged in parallel may be provided. Further, the switch SW2 and the switch SW3 are provided to set the output impedance of the paths that pass through the LNA part 2 and the LNA part 4 viewed from the output terminal OUT to a high impedance, and are not necessarily provided.

Next, the operation of the low noise amplifier circuit 1 according to the second embodiment will be described. The comparator 3b provides the result of comparison between the received frequency setting signal FREQ and the reference signal FREF to the digital controller 3c. When the received frequency setting signal FREQ is lower than the reference signal VREF, that is, when the received RF received signal is lower than a certain frequency, for example, when the LNA part 2 is designed as an amplifier capable of obtaining optimum characteristics in a low frequency band, in the digital controller 3c, the switch SW3 is controlled to be off and the switch SW2 is controlled to be on. Further, the digital controller 3c generates a control signal CG for controlling the switch SW11 of the LNA part 2 to be off and controlling the input transistor M12 to be on. In addition, the digital controller 3c generates a control signal CG for controlling the switch SW11 of the LNA part 4 to be on and controlling the input transistor M12 to be off. In FIG. 3, SW11' and CG' represent control signals having polarities opposite to those of SW11 and CG.

Thus, a path that passes through the input terminal IN, the LNA part 2, the switch SW2, and the output terminal OUT is formed, and the RF received signal is amplified by the LNA part 2 and generated. In other words, in the LNA part 2, since the input transistor M12 is in the on state, the received RF received signal is amplified with a constant amplification factor and generated from the output terminal LNAOUT. In addition, in the path that passes through the LNA part 4, since the input transistor M12 is in the off state, that is, the LNA part 4 is in the state of being powered off (hereinafter, also referred to as LNA being powered off), the power consumption can be reduced accordingly.

On the other hand, when the received frequency setting signal FREQ is equal to or higher than the reference signal FREF, the digital controller 3c controls the switch SW3 to be on and the switch SW2 to be off. Further, the digital controller 3c generates a control signal CG for controlling the switch SW11 of the LNA part 2 to be on and controlling the input transistor M12 to be off. In addition, a control signal CG' is generated for controlling the switch SW11 of the LNA part 4 to be off and controlling the input transistor M12 to be on. Thus, a path that passes through the input terminal IN, the LNA part 4, the switch SW1, and the output terminal OUT is formed, and the RF received signal is amplified by the LNA part 4 and generated. In other words, in the LNA part 4, since the input transistor M12 is in the on state, the received RF received signal is amplified with a constant amplification factor and generated from the output terminal LNAOUT. Further, in the path that passes through the LNA part 2, since the input transistor M12 is in the off state, that is, the LNA part 2 is in the state of being powered off, the power consumption can be reduced accordingly.

As described above, when the received frequency setting signal FREQ is equal to or higher than the reference signal FREF, if the received RF received signal is higher than a certain frequency, for example, when the LNA part 4 is designed as an amplifier capable of obtaining optimum characteristics in a high frequency band, it is possible to amplify the signal with the LNA part 4 having better characteristics at a high frequency than the LNA part 2. Thus, by selecting the LNA having the optimum characteristics based on whether the received frequency setting signal FREQ is equal to or higher than the reference signal FREF, it is possible to realize the LNA having good characteristics at a wide band frequency. Also, in this case, in the LNA part 2 or 4 which is powered on, the switch SW11 serving as a resistance component is coupled in parallel with the capacitor Cgs serving as an input matching element, so that when the LNA is powered off, the input impedance does not become "0Ω" at the resonance frequency. In addition, when the LNA is powered on, the resistance component is removed from the input matching element, that is, the series relationship is eliminated, so that it is possible to prevent the noise characteristic from deteriorating due to the change of the resistance component resulting from the switch SW11. Therefore, it is possible to obtain the same effect as in the first embodiment.

Figure 4:
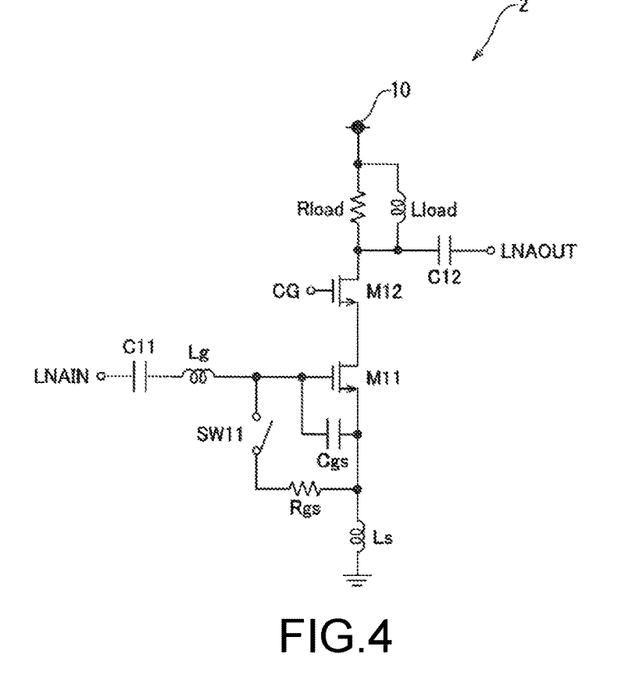
FIG. 4 is a configuration diagram showing an example of the LNA part according to the third embodiment.

Next, the third embodiment of the disclosure will be described. The low noise amplifier circuit according to the third embodiment is different from the low noise amplifier circuit shown in FIG. 1 in the configuration of the LNA part 2. FIG. 4 is a circuit diagram showing an example of the LNA part 2 according to the third embodiment of the disclosure. The same parts as those of the LNA part 2 according to the first embodiment of FIG. 2 are assigned with the same reference numerals, and detailed description thereof will be omitted. The LNA part 2 according to the third embodiment is different from the LNA part 2 shown in FIG. 2 in further including a resistor Rgs. That is, as shown in FIG. 4, the switch SW11 and the resistor Rgs, which are coupled in series, are coupled in parallel with the capacitor Cgs between the gate and the source of the input transistor M11 as a resistance component. The switch SW11 and the resistor Rgs coupled in series may have the switch SW11 coupled to the gate side of the input transistor M11 or conversely coupled to the source side. The on-resistance Ron of the switch SW11, the resistor Rgs, the transconductance gm of the input transistor M11, and the values of the source inductor Ls, the gate inductor Lg, and the capacitor Cgs serving as the input matching elements are set so as to satisfy the setting conditions of the values in the first embodiment, including the resistor Rgs, in the same procedure as in the first embodiment.

Switching of the signal path in the low noise amplifier circuit 1 is performed similarly to the first embodiment. In other words, when a path that passes through the LNA part 2 is formed, the switch SW11 is turned off. Therefore, the resistance component is removed from the input matching element, and the input signal can be amplified without deteriorating the noise characteristic. On the other hand, when the detour path is formed, the switch SW11 is turned on, so it is possible to prevent the input impedance viewed from the side of the input terminal IN of the low noise amplifier circuit 1 from becoming "0Ω" at the resonance frequency even if the input transistor M12 is turned off and the LNA is powered off due to the formation of the detour path. Therefore, the signal can be passed through the detour path. In the LNA part 2 according to the second embodiment, the switch SW11 may or may not have a sufficient resistance component. When the switch SW11 does not have the on-resistance Ron as the resistance component, the input impedance viewed from the side of the input terminal IN of the low noise amplifier circuit 1 can be expressed by the following equation (4), and when the switch SW11 has the on-resistance Ron, the input impedance can be expressed by the following equation (5).

$$Z_{in} = R_{gs} // \frac{1}{j\omega_0 C_{gs}} + j\omega_0(L_s + L_g) \quad (4)$$

$$Z_{in} = (R_{gs} + R_{on}) // \frac{1}{j\omega_0 C_{gs}} + j\omega_0(L_s + L_g) \quad (5)$$

As can be seen from the equations (4) and (5), it is understood that the input impedance does not become "0Ω" regardless of whether the switch SW11 has the on-resistance Ron. Therefore, in this case, it is also possible to obtain the same effect as the low noise amplifier circuit 1 in the first embodiment.

Figure 5:
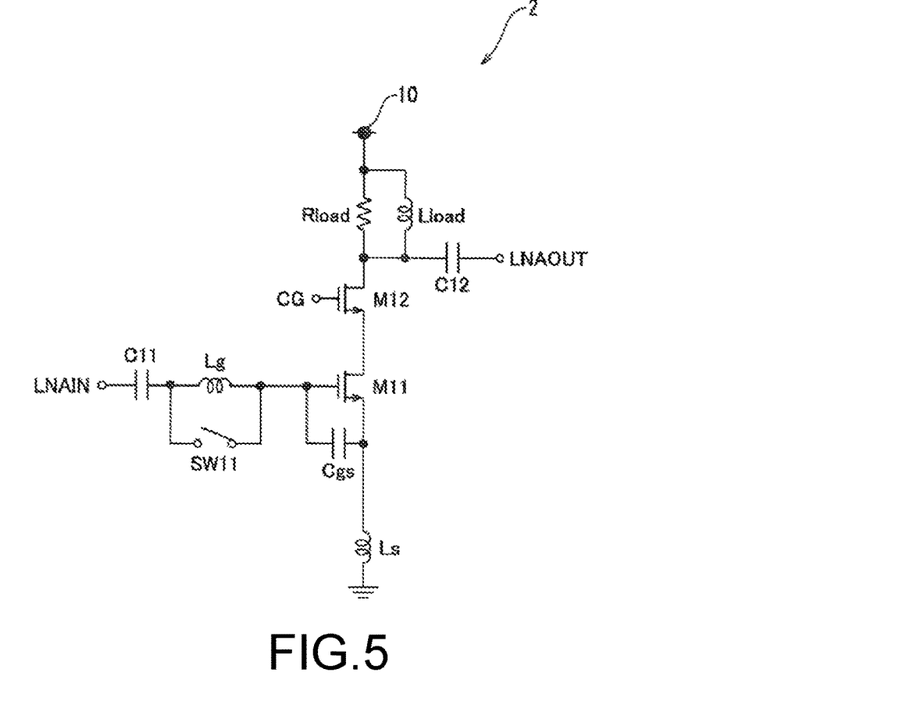
FIG. 5 is a configuration diagram showing an example of the LNA part according to the fourth embodiment.

Next, the fourth embodiment of the disclosure will be described. The low noise amplifier circuit according to the fourth embodiment is different from the low noise amplifier circuit shown in FIG. 1 in the configuration of the LNA part 2. FIG. 5 is a circuit diagram showing an example of the LNA part 2 according to the fourth embodiment of the disclosure. The same parts as those of the LNA part 2 according to the first embodiment of FIG. 2 are assigned with the same reference numerals, and detailed description thereof will be omitted. The LNA part 2 according to the fourth embodiment is different from the LNA part 2 shown in FIG. 2 in that the switch SW11 having the on-resistance Ron is not provided in parallel with the capacitor Cgs but is provided in parallel with the gate inductor Lg, as shown in FIG. 5. The on-resistance Ron of the switch SW11, the transconductance gm of the input transistor M11, and the values of the source inductor Ls, the gate inductor Lg, and the capacitor Cgs serving as the input matching elements are set in the same procedure as that of the LNA part 2 in the first embodiment.

Switching of the signal path in the low noise amplifier circuit 1 is performed similarly to the first embodiment. In other words, when a path that passes through the LNA part 2 is formed, the switch SW11 is turned off. Therefore, the resistance component is removed from the input matching element, and the input signal can be amplified without deteriorating the noise characteristic. On the other hand, when the detour path is formed, the switch SW11 is turned on, so it is possible to prevent the input impedance viewed from the side of the input terminal IN of the low noise amplifier circuit 1 from becoming "0Ω" at the resonance frequency even if the LNA is powered off due to the formation of the detour path. Therefore, the signal can be passed through the detour path.

Here, when the input transistor M12 is controlled to be on, the switch SW11 is controlled to be off, so if the off-resistance Roff of the switch SW11 is treated as infinity, the input impedance can be approximated by the equation (1). When the LNA is powered on, since the switch coupled in series with the input matching element is not turned on, the noise characteristic does not deteriorate. Further, when the LNA is powered off, the input impedance can be expressed by the following equation (6), and the input impedance at the resonance frequency $\omega_0$ does not become "0Ω".

$$Z_{in} = R_{on} \,//\, j\omega_0 L_g + j\omega_0 L_s + \frac{1}{j\omega_0 C_{gs}} \qquad (6)$$

Therefore, in this case, it is also possible to obtain the same effect as the low noise amplifier circuit 1 in the first embodiment.

Figure 6:
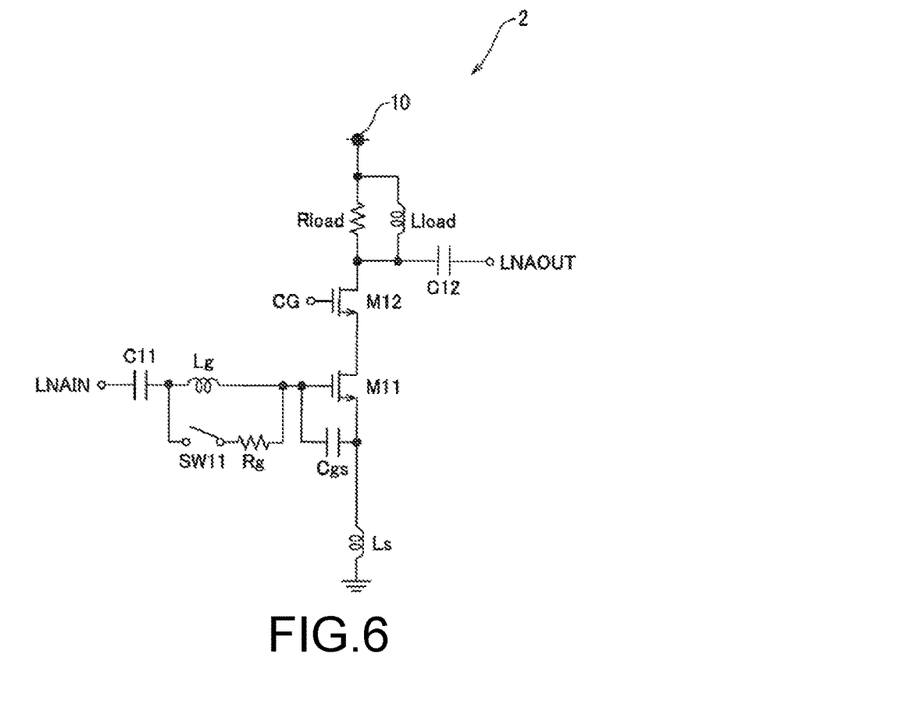
FIG. 6 is a configuration diagram showing an example of the LNA part according to the fifth embodiment.

Next, the fifth embodiment of the disclosure will be described. The low noise amplifier circuit according to the fifth embodiment is different from the low noise amplifier circuit according to the third embodiment in the configuration of the LNA part 2. FIG. 6 is a circuit diagram showing an example of the LNA part 2 according to the fifth embodiment of the disclosure. The same parts as those of the LNA part 2 according to the fourth embodiment shown in FIG. 5 are assigned with the same reference numerals, and detailed description thereof will be omitted. The LNA part 2 according to the fifth embodiment is to further provide a resistor Rg coupled in series with the switch SW11 and provide the switch SW11 and the resistor Rg which are coupled in series in parallel with the gate inductor Lg in the LNA part 2 according to the fourth embodiment shown in FIG. 5. The on-resistance Ron of the switch SW11, the resistor Rg, the transconductance gm of the input transistor M11, and the values of the source inductor Ls, the gate inductor Lg, and the capacitor Cgs serving as the input matching elements are set so as to satisfy the setting conditions of the values in the first embodiment, including the resistor Rg, in the same procedure as in the first embodiment.

Switching of the signal path in the low noise amplifier circuit 1 is performed similarly to the first embodiment. In other words, when a path that passes through the LNA part 2 is formed, the switch SW11 is turned off. Therefore, the resistance component is removed from the input matching element, and the input signal can be amplified without deteriorating the noise characteristic. On the other hand, when the detour path is formed, the switch SW11 is turned on, so it is possible to prevent the input impedance viewed from the side of the input terminal IN of the low noise amplifier circuit 1 from becoming "0Ω" at the resonance frequency even if the detour path is formed and the LNA is powered off. Therefore, the signal can be passed through the detour path.

Therefore, in this case, the switch coupled in series with the input matching element is not turned on when the LNA is powered on, so it is possible to prevent the deterioration of the noise characteristic. Further, when the LNA is powered off, the input impedance can be expressed by the following equation (7), and the input impedance at the resonance frequency $\omega_0$ does not become "0Ω". The switch SW11 may or may not have a sufficient on-resistance Ron. When the switch SW11 has the on-resistance Ron, the input impedance can be expressed by the following equation (8).

$$Z_{in} = R_g \,//\, j\omega_0 L_g + j\omega_0 L_s + \frac{1}{j\omega_0 C_{gs}} \qquad (7)$$

$$Z_{in} = (R_g + R_{on}) \,//\, j\omega_0 L_g + j\omega_0 L_s + \frac{1}{j\omega_0 C_{gs}} \qquad (8)$$

Therefore, in this case, it is also possible to obtain the same effect as the low noise amplifier circuit 1 in the fourth embodiment.

Figure 7:
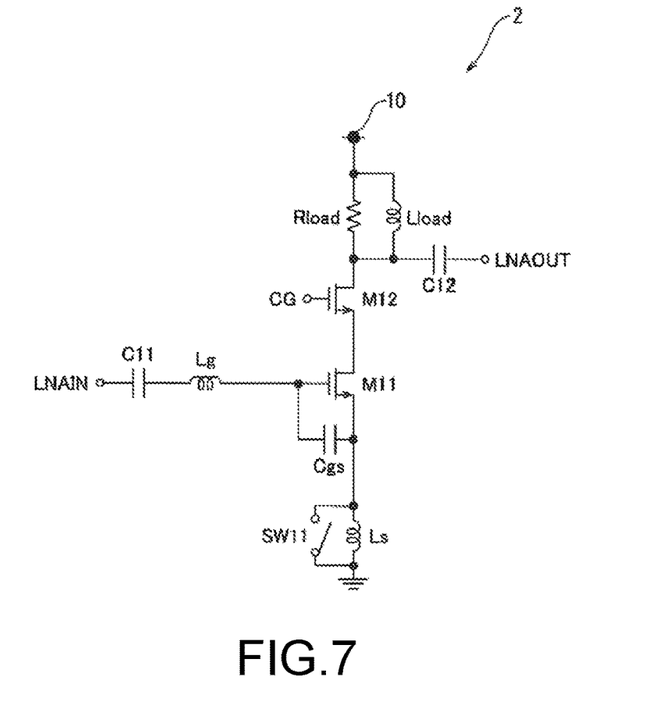
FIG. 7 is a configuration diagram showing an example of the LNA part according to the sixth embodiment.

Next, the sixth embodiment of the disclosure will be described. The low noise amplifier circuit according to the sixth embodiment is different from the low noise amplifier circuit shown in FIG. 1 in the configuration of the LNA part 2. FIG. 7 is a circuit diagram showing an example of the LNA part 2 according to the sixth embodiment of the disclosure. The same parts as those of the LNA part 2 according to the first embodiment of FIG. 2 are assigned with the same reference numerals, and detailed description thereof will be omitted. The LNA part 2 according to the sixth embodiment is different from the LNA part 2 shown in FIG. 2 in that the switch SW11 having the on-resistance Ron is not provided in parallel with the capacitor Cgs but is provided in parallel with the source inductor Ls. The on-resistance Ron of the switch SW11, the transconductance gm of the input transistor M11, and the values of the source inductor Ls, the gate inductor Lg, and the capacitor Cgs serving as the input matching elements are set in the same procedure as that of the LNA part 2 in the first embodiment.

Switching of the signal path in the low noise amplifier circuit 1 is performed similarly to the first embodiment. In other words, when a path that passes through the LNA part 2 is formed, the switch SW11 is turned off. Therefore, the resistance component is removed from the input matching element, and the input signal can be amplified without deteriorating the noise characteristic. On the other hand, when the detour path is formed, the switch SW11 is turned on, so it is possible to prevent the input impedance viewed from the side of the input terminal IN of the low noise amplifier circuit 1 from becoming "0Ω" at the resonance frequency even if the LNA is powered off due to the formation of the detour path. Therefore, the signal can be passed through the detour path. When the LNA is powered on, since the switch coupled in series with the input matching element is not turned on, the noise characteristic does not deteriorate. Further, when the LNA is powered off, the input impedance can be expressed by the following equation (9), and the input impedance at the resonance frequency $\omega_0$ does not become "0Ω".

$$Z_{in} = R_{on} \;//\; j\omega_0 L_s + j\omega_0 L_g + \frac{1}{j\omega_0 C_{gs}} \quad (9)$$

Therefore, in this case, it is also possible to obtain the same effect as the low noise amplifier circuit 1 in the first embodiment.

Figure 8:
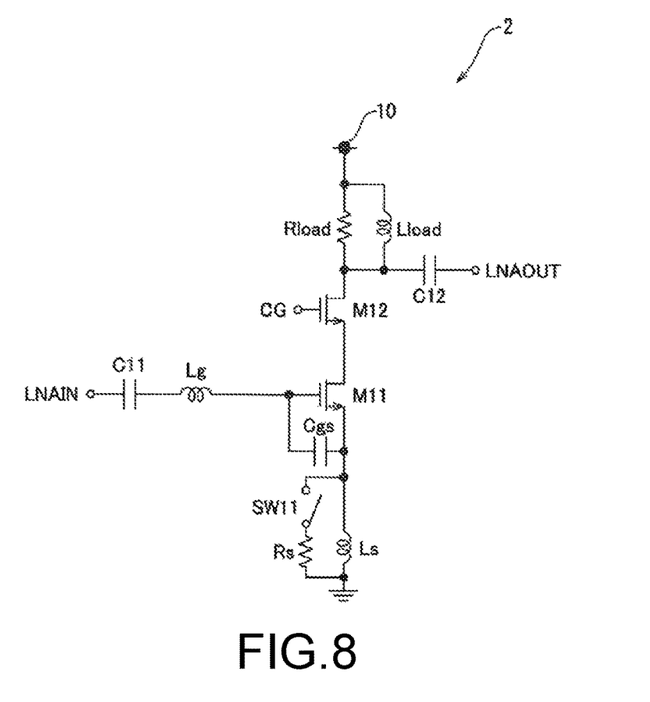
FIG. 8 is a configuration diagram showing an example of the LNA part according to the seventh embodiment.

Next, the seventh embodiment of the disclosure will be described. The low noise amplifier circuit according to the seventh embodiment is different from the low noise amplifier circuit according to the fifth embodiment in the configuration of the LNA part 2. FIG. 8 is a circuit diagram showing an example of the LNA part 2 according to the seventh embodiment of the disclosure. The same parts as those of the LNA part 2 according to the sixth embodiment of FIG. 7 are assigned with the same reference numerals, and detailed description thereof will be omitted. The LNA part 2 according to the seventh embodiment is to further provide a resistor Rs coupled in series with the switch SW11 and provide the switch SW11 and the resistor Rs which are coupled in series in parallel with the source inductor Ls in the LNA part 2 according to the sixth embodiment shown in FIG. 7. The on-resistance Ron of the switch SW11, the resistor Rs, the transconductance gm of the input transistor M11, and the values of the source inductor Ls, the gate inductor Lg, and the capacitor Cgs serving as the input matching elements are set so as to satisfy the setting conditions of the values in the first embodiment, including the resistor Rs, in the same procedure as in the first embodiment.

Switching of the signal path in the low noise amplifier circuit 1 is performed similarly to the first embodiment. In other words, when a path that passes through the LNA part 2 is formed, the switch SW11 is turned off. Therefore, the resistance component is removed from the input matching element, and the input signal can be amplified without deteriorating the noise characteristic. On the other hand, when the detour path is formed, the switch SW11 is turned on, so it is possible to prevent the input impedance viewed from the side of the input terminal IN of the low noise amplifier circuit 1 from becoming "0Ω" at the resonance frequency even if the detour path is formed and the LNA is powered off. Therefore, the signal can be passed through the detour path.

Therefore, in this case, the switch coupled in series with the input matching element is not turned on when the LNA is powered on, so the noise characteristic does not deteriorate. Further, when the LNA is powered off, the input impedance can be expressed by the following equation (10), and the input impedance at the resonance frequency $\omega_0$ does not become "0Ω". The switch SW11 may or may not have a sufficient on-resistance Ron. When the switch SW11 has the on-resistance Ron, the input impedance can be expressed by the following equation (11).

$$Z_{in} = R_s \;//\; j\omega_0 L_s + j\omega_0 L_g + \frac{1}{j\omega_0 C_{gs}} \quad (10)$$

$$Z_{in} = (R_s + R_{on}) \;//\; j\omega_0 L_s + j\omega_0 L_g + \frac{1}{j\omega_0 C_{gs}} \quad (11)$$

Therefore, in this case, it is also possible to obtain the same effect as the low noise amplifier circuit 1 in the fifth embodiment.

Figure 9:
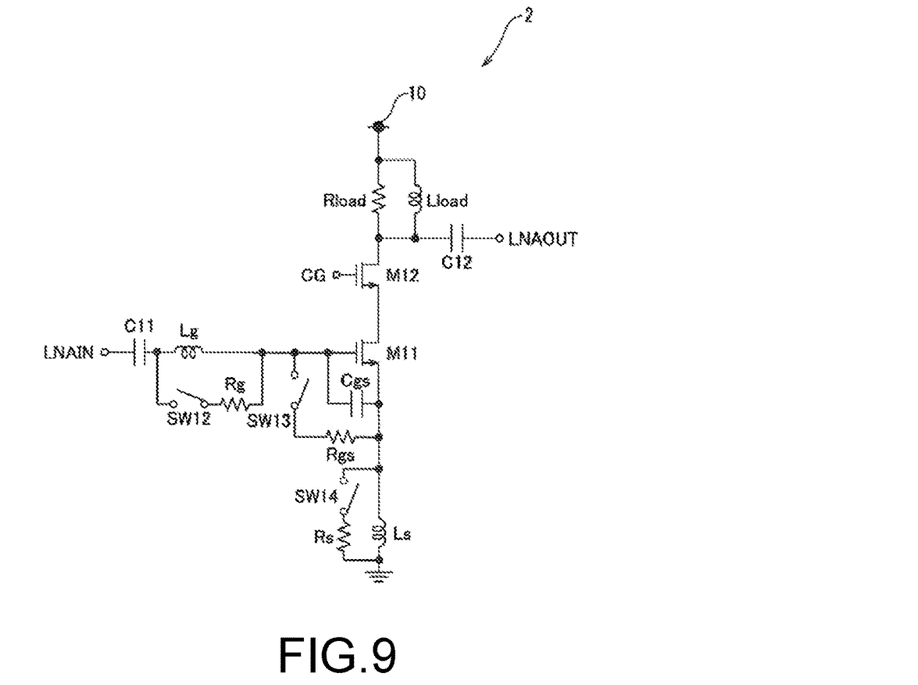
FIG. 9 is a configuration diagram showing an example of the LNA part according to the eighth embodiment.

Next, the eighth embodiment of the disclosure will be described. The low noise amplifier circuit according to the eighth embodiment is different from the low noise amplifier circuit shown in FIG. 1 in the configuration of the LNA part 2. FIG. 9 is a circuit diagram showing an example of the LNA part 2 according to the eighth embodiment of the disclosure. The same parts as those of the LNA part 2 according to the first embodiment of FIG. 2 are assigned with the same reference numerals, and detailed description thereof will be omitted. The LNA part 2 according to the eighth embodiment is different from the LNA part 2 shown in FIG. 2 in that the switch SW11 having the on-resistance Ron is not provided in parallel with the capacitor Cgs; instead, a switch SW and a resistor R which are coupled in series are coupled in parallel with each of the gate inductor Lg, the capacitor Cgs, and the source inductor Ls serving as the input matching elements, as shown in FIG. 9. That is, a switch SW12 and a resistor Rg which are coupled in series are coupled in parallel with the gate inductor Lg, a switch SW13 and a resistor Rgs which are coupled in series are coupled in parallel with the capacitor Cgs, and a switch SW14 and a resistor Rs which are coupled in series are coupled in parallel with the source inductor Ls. The switch SW and the resistor R coupled in parallel with each input matching element may have the switch SW coupled to the side of the input terminal LNAIN or conversely have the switch SW coupled to the low potential side.

In this case, the on-resistance Ron of the switch SW11, the resistor Rg, the resistor Rgs, the resistor Rs, the transconductance gm of the input transistor M11, and the values of the source inductor Ls, the gate inductor Lg, and the capacitor Cgs serving as the input matching elements may also be set so as to satisfy the setting conditions of the values in the first embodiment, including the resistor Rg, the resistor Rgs, and the resistor Rs, in the same procedure as in the first embodiment. Further, each of the switches SW12 to SW14 may or may not have a sufficient on-resistance Ron.

Switching of the signal path in the low noise amplifier circuit 1 is performed similarly to the first embodiment. In other words, when a path that passes through the LNA part 2 is formed, the switches SW12 to SW14 are turned off. Therefore, the resistance component is removed from the input matching element, and the input signal can be amplified without deteriorating the noise characteristic. On the other hand, when the detour path is formed, the switches SW12 to SW14 are turned on, so it is possible to prevent the input impedance viewed from the side of the input terminal IN of the low noise amplifier circuit 1 from becoming "0Ω" at the resonance frequency even if the LNA is powered off due to the formation of the detour path. Therefore, the signal can be passed through the detour path. That is, in this case, it is also possible to obtain the same effect as the low noise amplifier circuit 1 in the first embodiment.

Figure 10:
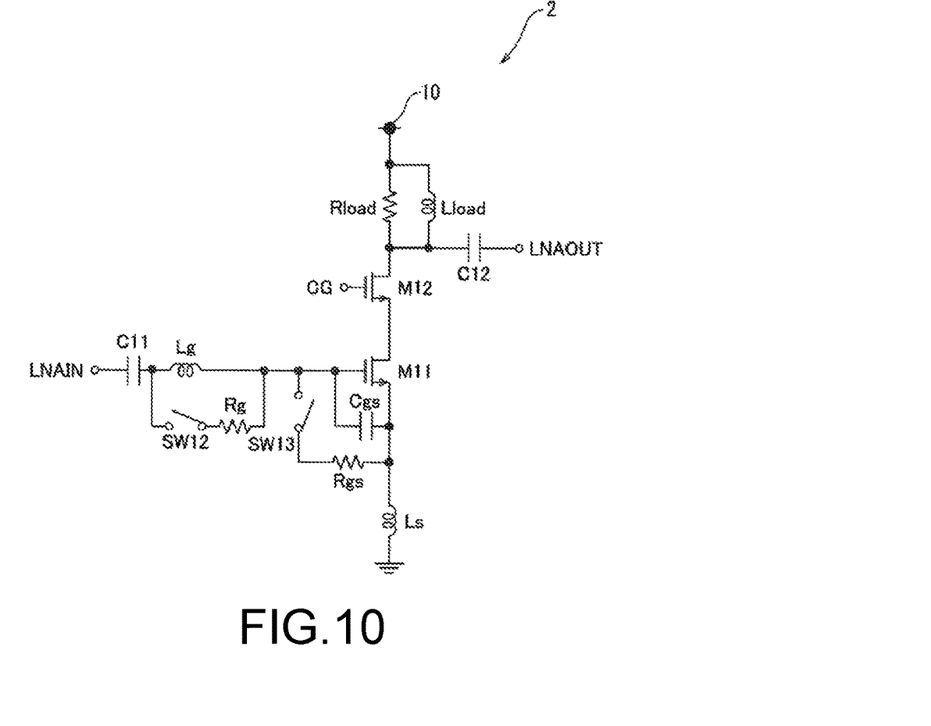
FIG. 10 is a modified example of the LNA part.
Figure 11:
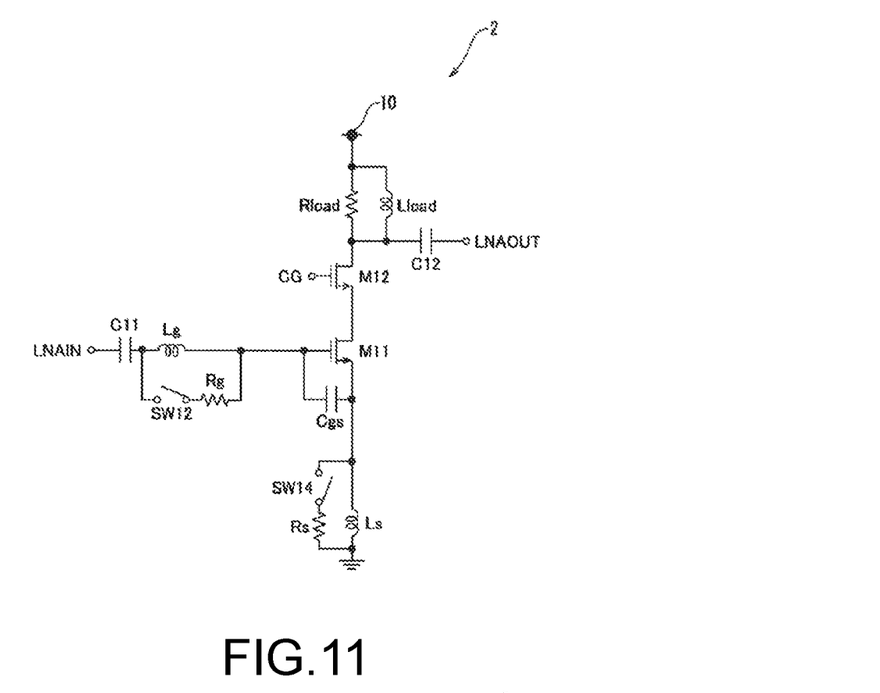
FIG. 11 is a modified example of the LNA part.

The eighth embodiment illustrates a case where the switch SW and the resistor R which are coupled in series are coupled in parallel with each of the source inductor Ls, the gate inductor Lg, and the capacitor Cgs serving as the input matching elements. However, the disclosure is not limited thereto. For example, as shown in FIG. 10 to FIG. 12, the switch SW and the resistor R which are coupled in series may be coupled in parallel with only two of the source inductor Ls, the gate inductor Lg, and the capacitor Cgs serving as the input matching elements.

Figure 13:
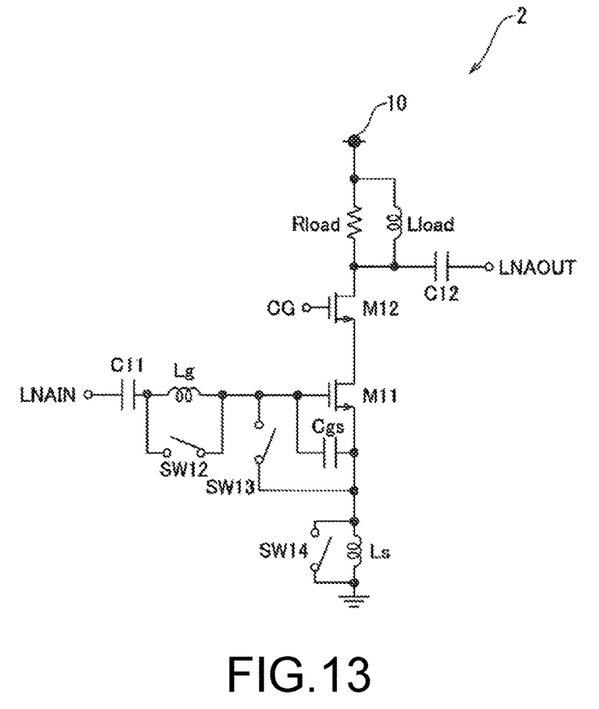
FIG. 13 is a modified example of the LNA part.
Figure 14:
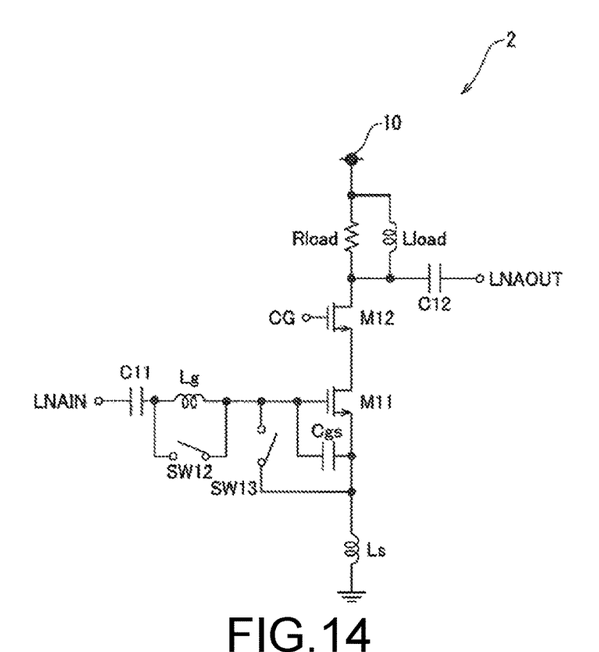
FIG. 14 is a modified example of the LNA part.
Figure 15:
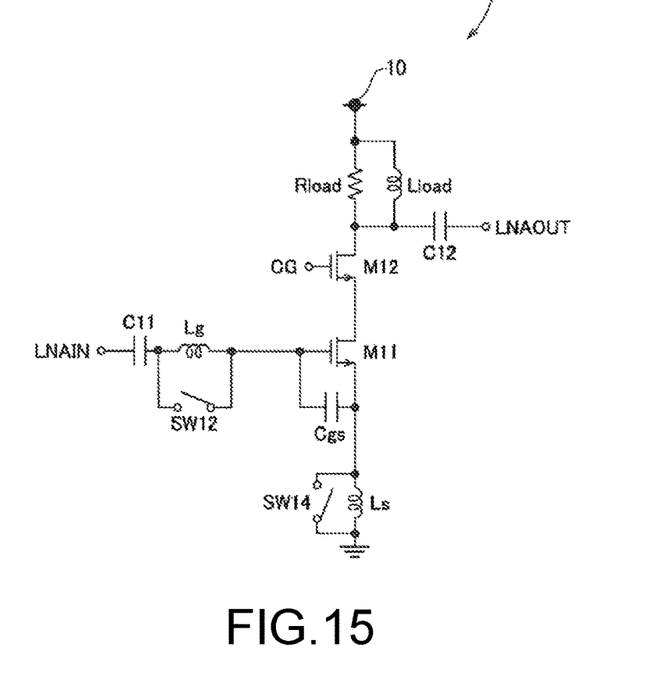
FIG. 15 is a modified example of the LNA part.
Figure 16:
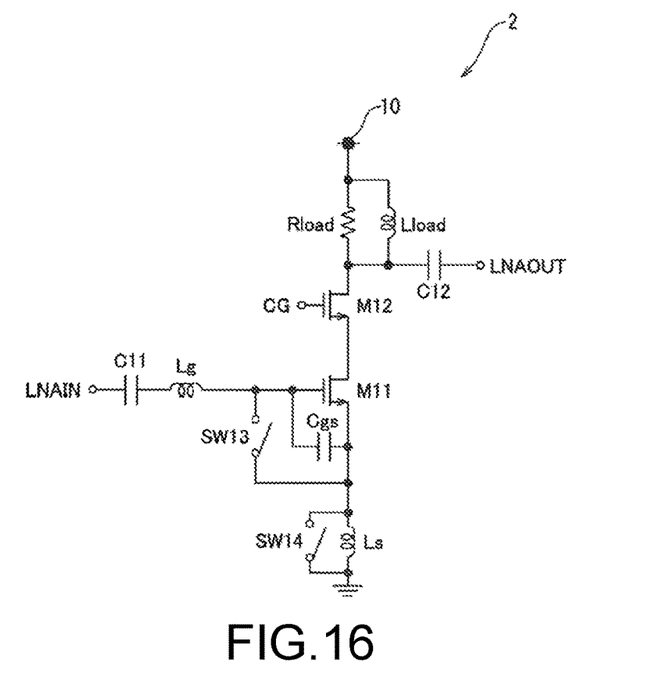
FIG. 16 is a modified example of the LNA part.

In addition, FIG. 9 and FIG. 10 to FIG. 12 illustrate a case where the switch SW and the resistor R which are coupled in series are coupled to any of the source inductor Ls, the gate inductor Lg, and the capacitor Cgs serving as the input matching elements. However, the disclosure is not limited thereto. As shown in FIG. 13, only the switches SW12 to SW14, without the resistor R, may be respectively coupled in parallel with the source inductor Ls, the gate inductor Lg, and the capacitor Cgs serving as the input matching elements. Similarly, as shown in FIG. 14 to FIG. 16, only the switches SW may be coupled in parallel with only two of the source inductor Ls, the gate inductor Lg, and the capacitor Cgs serving as the input matching elements.

Furthermore, an input matching element, with which the switch SW and the resistor R coupled in series are coupled in parallel, and an input matching element, with which only the switch SW is coupled in parallel, may be mixed. In each of the above embodiments, the LNA part 2 can be applied if the LNA part 2 includes a configuration that the input transistor M11 and the source inductor Ls are coupled between the first power supply 10 and the second power supply (low potential side), the capacitor C11 and the gate inductor Lg are coupled between the input terminal LNAIN and the gate of the input transistor M11, and further the capacitor Cgs is coupled between the gate and the source of the input transistor M11. For example, the arrangement of the capacitor C11 and the gate inductor Lg may be reversed. In addition, the capacitor Cgs may be a parasitic component, and the source inductor Ls may also be a parasitic component.

Further, in the above third to eighth embodiments, as shown in FIG. 3, it is also possible to provide two LNA parts coupled in parallel, and select the LNA part that provides the optimum characteristics in the band specified by the received frequency setting signal FREQ according to whether the received frequency setting signal FREQ is equal to or higher than the threshold value. However, the disclosure is not limited to the case of providing two LNA parts coupled in parallel. It is also possible to provide three or more LNA parts in parallel, and select the LNA part suitable for the band specified by the received frequency setting signal FREQ. Furthermore, as shown in FIG. 1, a bypass switch SW1 may be provided in parallel to a plurality of LNA parts provided in parallel, and a bypass path that does not pass through any LNA part may be provided.

The embodiments of the disclosure have been described above. Nevertheless, the above embodiments are examples of devices and methods for embodying the technical idea of the disclosure, and the technical idea of the disclosure does not specify the material, shape, structure, arrangement, etc. of the components. Various modifications can be added to the technical idea of the disclosure within the technical scope defined by the claims below.

What is claimed is:

1. A low noise amplifier circuit, comprising:
a plurality of paths provided between an input terminal and an output terminal;
a low noise amplifier provided in at least one of the plurality of paths and comprising:
a MOS transistor coupled between a first power supply and a second power supply;
a first inductor coupled to a source terminal of the MOS transistor;
a capacitor formed between a gate terminal and the source terminal of the MOS transistor;
a second inductor coupled between the gate terminal of the MOS transistor and the input terminal; and
a changeover switch coupled in parallel with at least one of the first inductor, the capacitor, and the second inductor; and
a selector selecting one of the plurality of paths,
wherein the selector switches between a first state, in which a path that does not comprise the low noise amplifier is selected and the changeover switch is turned on, and a second state, in which a path that comprises the low noise amplifier is selected and the changeover switch is turned off.

2. The low noise amplifier circuit according to claim 1, wherein at least one of the plurality of paths is a first path transmitting an input signal from the input terminal to the output terminal, and
the selector switches between the first state, in which the first path is selected and the changeover switch is turned on, and the second state, in which the path that comprises the low noise amplifier is selected and the changeover switch is turned off.

3. The low noise amplifier circuit according to claim 1, wherein the changeover switch comprises:
a switch circuit; and
a resistor element coupled in series with the switch circuit.

4. A low noise amplifier circuit, comprising:
a first path transmitting an input signal from an input terminal to an output terminal;
a second path provided in parallel with the first path and comprising a low noise amplifier comprising:
a MOS transistor coupled between a first power supply and a second power supply; a first inductor coupled to a source terminal of the MOS transistor;
a capacitor formed between a gate terminal and the source terminal of the MOS transistor;
a second inductor coupled between the gate terminal of the MOS transistor and the input terminal; and
a changeover switch coupled in parallel with at least one of the first inductor, the capacitor, and the second inductor; and
a selector selecting one of the first path and the second path as a path transmitting the input signal,
wherein the selector switches between a first state, in which the first path is selected and the changeover switch is turned on, and a second state, in which the second path is selected and the changeover switch is turned off.

5. The low noise amplifier circuit according to claim 4, wherein the changeover switch comprises:
a switch circuit; and
a resistor element coupled in series with the switch circuit.

* * * * *